(12) United States Patent
Robinson et al.

(10) Patent No.: US 6,396,295 B1
(45) Date of Patent: May 28, 2002

(54) SYSTEM AND METHOD FOR COMBINING INTEGRATED CIRCUIT FINAL TEST AND MARKING

(75) Inventors: Donald E. Robinson, San Jose; Mo Bandali, Los Gatos, both of CA (US)

(73) Assignee: Integrated Silicon Solution, Inc., Santa Clara, CA (US)

( * ) Notice: Subject to any disclaimer, the term of this patent is extended or adjusted under 35 U.S.C. 154(b) by 0 days.

(21) Appl. No.: 09/088,961

(22) Filed: Jun. 2, 1998

(51) Int. Cl.⁷ .............................................. G01R 31/26
(52) U.S. Cl. ........................ 324/765; 209/573
(58) Field of Search ............................. 324/754, 158.2; 209/573

(56) References Cited

U.S. PATENT DOCUMENTS

| | | | | |
|---|---|---|---|---|
| 4,832,174 A | * | 5/1989 | Frisbie | 198/384 |
| 5,313,156 A | * | 5/1994 | Klug et al. | 324/158.1 |
| 5,603,412 A | * | 2/1997 | Gross, Jr. et al. | 209/571 |
| 5,614,109 A | * | 3/1997 | Cecil | 219/109 |
| 6,052,319 A | * | 4/2000 | Jacobs | 365/201 |
| 6,066,822 A | * | 5/2000 | Nemoto et al. | 209/573 |
| 6,156,078 A | * | 12/2000 | Huat | 29/25.01 |

OTHER PUBLICATIONS

Trigon Adcotech, "5000M Automatic Component Marker," (Copyright 1997–1998) 4 pages (Month Unavailable).

Trigon Adcotech, "3000M Semi–Automatic Marker," (Copyright 1997–1998) 2 pages (Month Unavailable).

Sym–Tek Systems, Inc., "MP3050 Series Operations & Maintenance Manual, Fig. 1–1A Series MP3050–By8/16 Environment Handler System," (Jul. 1990) one sheet.

GHI Inc., "Operators Manual for the Model 700 Seriex Handler, Fig. 1–1 The Model 700 Ambient–Ambient/Hot IC Handler," (Jan. 1990, Rev. 1) one sheet.

Atrium, Inc., "Model 3300 Multi–Package Handler Manual, Model 3300 Illustrated Parts List," (Sep. 1990) one sheet.

Micro Component Technology, "Model 3616DTS Technical Manual, MCT 3616DTS—Parts List," (Jun. 1985) 5 pages.

Micro Component Technology, "4610 Dual Handler Operation & Maintenance Instruction Manual, Fig. 1–1 4610 Dual Handler," (Apr. 1994) 3 sheets.

* cited by examiner

*Primary Examiner*—Safet Metjahic
*Assistant Examiner*—Russell M. Kobert
(74) *Attorney, Agent, or Firm*—Pennie & Edmonds LLP

(57) ABSTRACT

A testing station tests integrated circuits and determines if the integrated circuits pass or fail predefined tests. The integrated circuits are placed in a pass bin if the integrated circuits passed the tests, or a fail bin if the integrated circuits failed the tests. A marking station marks identification information on the integrated circuits in the pass bin. The testing and marking stations are both included in a single, integrated tester-marker system.

10 Claims, 8 Drawing Sheets

SYSTEM AND METHOD FOR COMBINING INTEGRATED CIRCUIT FINAL TEST AND MARKING

The present invention relates generally to integrated circuit testing systems and methods, and more specifically to systems and methods for performing final circuit performance testing and for marking the ceramic or plastic packaging in which integrated circuits are housed.

BACKGROUND OF THE INVENTION

Conventionally, after integrated circuits are diced and packaged, the integrated circuits are tested for short and open circuits from the leads extending from the packages. The circuits that fail the short and open circuit tests are discarded. The circuits that pass the short and open tests are loaded into a marking system for marking with circuit and manufacturer identification information, and then they are shipped to a final test facility. The final test facility is often at a different location from the assembly plant where the circuits are packaged.

At the final test facility, the circuits are subjected to a battery of circuit functionality tests, typically taking one to ten seconds per integrated circuit, depending on the type of integrated circuit. Some complex devices may require even longer final test times. The costs associated with final testing average several cents per integrated circuit, about half of which is attributable to the shipping of the packaged circuits to the final test facility and the cost of loading the circuits into the testers.

In accordance with the conventional circuit testing protocol, circuits that fail the final tests are marked with the same circuit and manufacturer information as circuits that pass. This creates opportunities for failed circuits to be purposely or inadvertently shipped or sold as though they were good circuits.

It is an object of the present invention to substantially reduce the cost of final testing packaged integrated circuits by combining the final testers with the integrated circuit package marking equipment.

It is another object of the present invention to prevent circuits that fail the final circuit tests from being marked with the same circuit and manufacturer information as circuits that pass.

SUMMARY OF THE INVENTION

A tester-marker system tests and marks integrated circuits. A testing station tests the integrated circuits and determines if the integrated circuits passed or failed. The integrated circuits are placed in a pass bin if the integrated circuits passed the tests. A marking station marks identification information on the integrated circuits in the pass bin.

In a method for testing and marking integrated circuits, a tester-marker system tests the integrated circuits and determines if the integrated circuits passed or failed. The tested integrated circuits are placed in a pass bin if the integrated circuits passed or a fail bin if the integrated circuits failed the tests. Identification information is marked on the integrated circuits in the pass bin.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1:
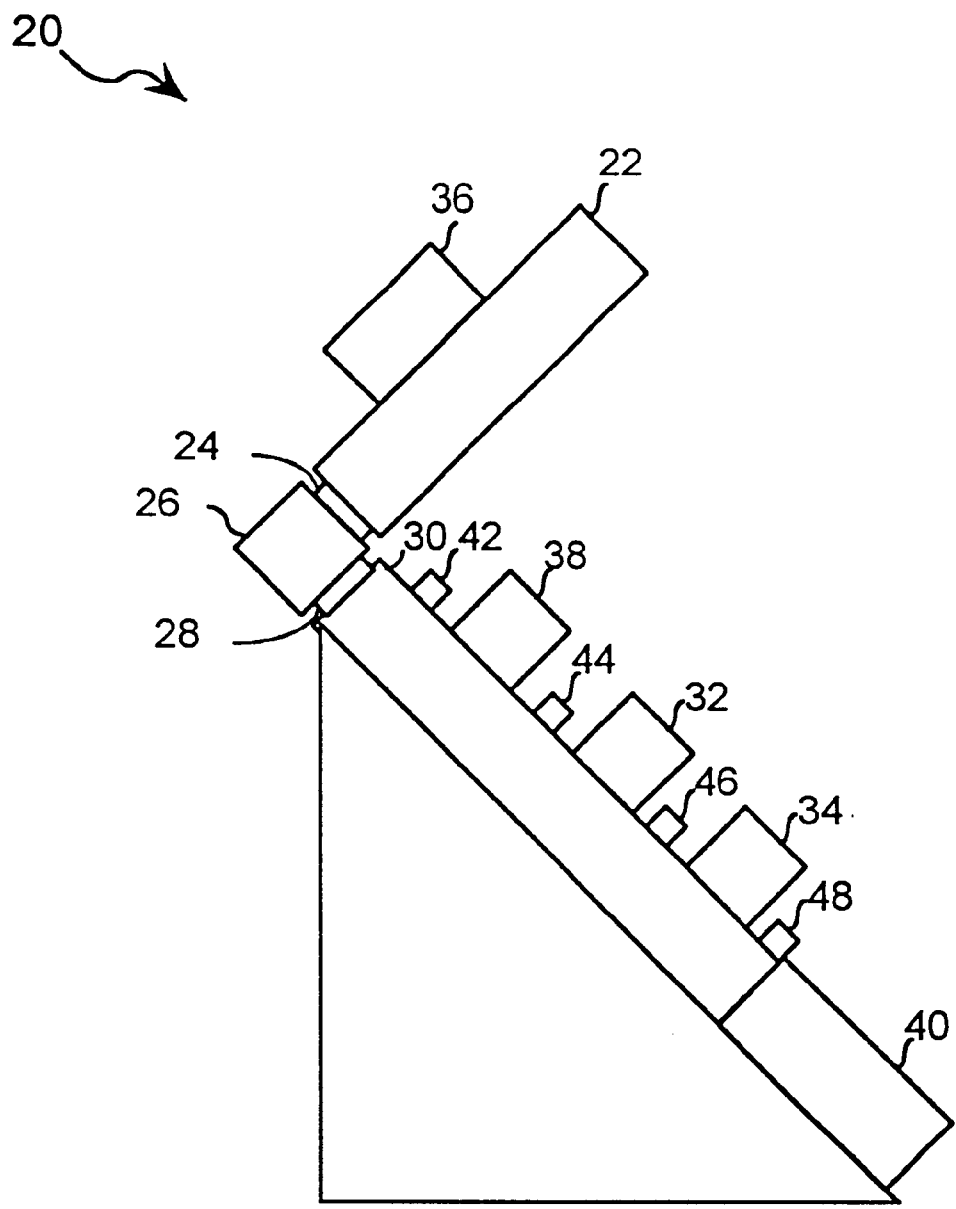
FIG. 1 is a side view of a first embodiment of a tester-marker system of the present invention.

FIG. 1 is a side view diagram of a first embodiment of a tester-marker system 20 of the present invention. A loader 22 receives integrated circuits. A handler 24 removes the integrated circuits from the loader and places the integrated circuits in a testing station 26.

The testing station 26 runs a set of tests and determines if the integrated circuits passed or failed. After testing, a second handler 28 places the integrated circuit in one of the bins 30. If the integrated circuit passed, the second handler 28 moves the integrated circuit from the testing station 26 to a pass bin. If the integrated circuit failed, the second handler 28 moves the integrated circuit from the testing station to a fail bin. Typically, the integrated circuits are tested one at a time. Alternately, multiple integrated circuits are tested simultaneously.

A programmable marking station 32 is disposed over the bins, and at least over the pass bin(s). The marking station 32 marks identification information on the integrated circuits in the pass bin(s) by applying ink or paint using well-known methods such as offset printing. Alternately, the programmable marker marks devices with unique identification information that indicates that the device passed certain tests such a supply current, speed and output drive current tests. In the preferred embodiment the failed circuits are not marked. However, in an alternate embodiment, the failed circuits are marked with a failed part mark that is distinct from the information marked on the passed circuits to reduce the possibility of defective parts being misidentified as passed circuits.

After marking, the integrated circuits move through the bins to an optional curing station 34 to dry the ink. The integrated circuits may automatically move using gravity or a conveyor. The curing station 34 can comprise a stop to hold the integrated circuit in place for a predetermined time to allow the ink or paint to dry. In addition, the curing station 34 can have a dryer to dry the ink or paint such as a UV lamp, infra-red lamp, a heater or a fan for forced air drying. The amount of time needed to dry the ink or paint varies and depends on the type of ink or paint and the method of curing. Typically infra-red curing takes about ten to fifteen seconds.

In addition, an optional environmental chamber 36 can be attached to the loader 22 to stress the integrated circuits before testing. Typically, the integrated circuits are heated. An optional cool-down station 38 can be attached to the bins to allow the integrated circuits to cool sufficiently before applying the ink or paint.

The marker-tester system 20 may also have an unloader 40 after the marking and curing stations, 32 and 34 respectively. The unloader 40 acts as a queuing area to accumulate the marked integrated circuits for packing and storing in plastic rails. The failed circuits may be directed into a waste container instead of plastic rails.

Detectors 42, 44, 46 and 48 are placed in front of the cool-down station 38, marking station 32, curing station 34 and unloader 40 to determine whether an integrated circuit has moved into one of the stations. The detectors 42, 44, 46 and 48 can also be used to detect overflow conditions or jams, and to set alarms appropriately. In one embodiment, each bin has a set of detectors. In an alternative embodiment, the detectors 42, 44, 46 and 48 are part of each station, 38, 32, 34 and 40 respectively.

Figure 2:
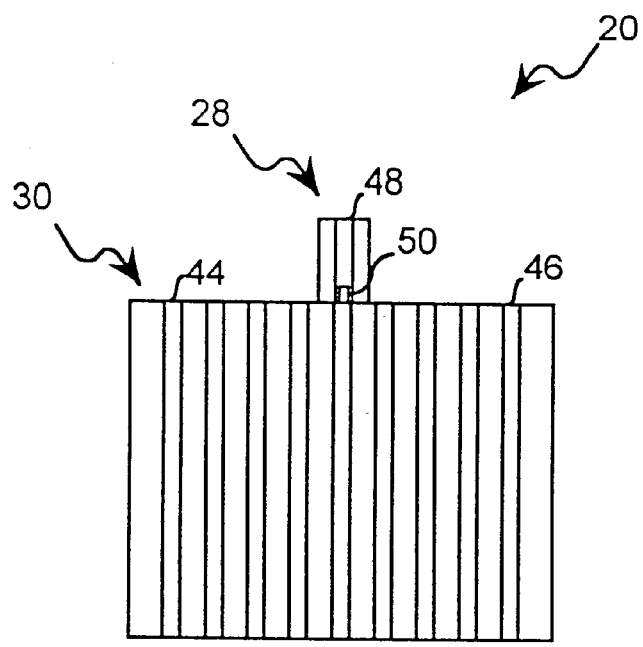
FIG. 2 is a front view of the bins of the tester-marker system of FIG. 1.

FIG. 2 is a front view of the bins 30 of the tester-marker system of FIG. 1. The testing station 20 has a programmable controller and at least one bin is designated as a pass bin 44 and another bin is designated as a fail bin 46. The second handler 28 is a shuttle that has a sorter-bin 48 that holds an integrated circuit 50. The second handler 28 moves horizontally along the bins 30 to align the sorter bin 48 over the desired pass or fail bin. After alignment, the second handler 28 releases the integrated circuit 50 and gravity causes the integrated circuit 50 to move off the second handler 28 and into the desired bin.

Alternately, multiple bins are designated as pass bins and fail bins. In addition, pass bins can have different designations, such as for sorting integrated circuits based on the results of a speed test. For example, one pass bin can be used for high speed integrated circuits and a second pass bin can be used for low speed integrated circuits. Similarly, in an alternate embodiment, the fail bins can be designated to sort integrated circuits based on the type of failure.

In an alternate embodiment, the marking station 32 is configured to mark each integrated circuit with unique identifying information associated with the bin designation.

Figure 3:
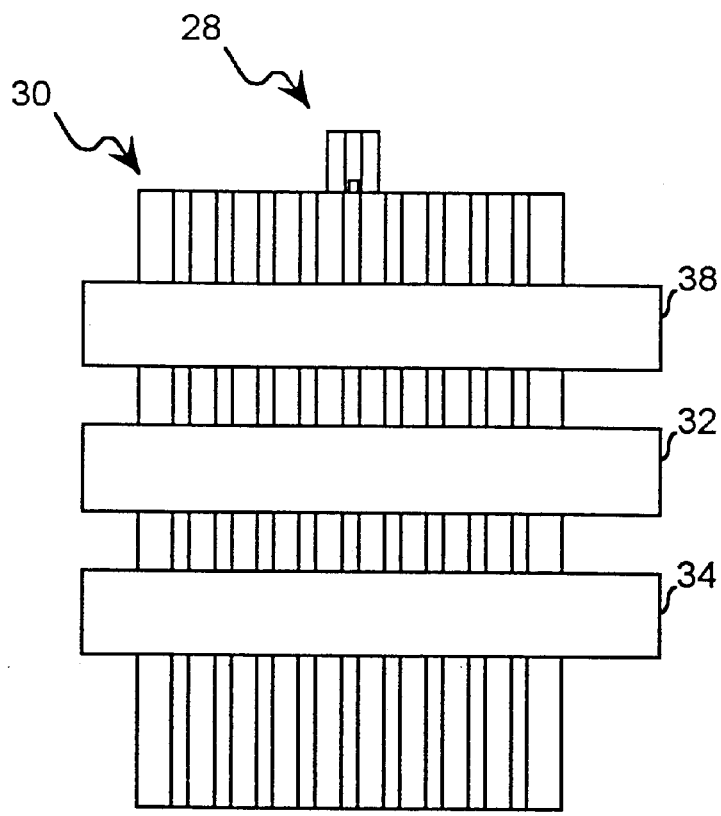
FIG. 3 is a front view of the tester-marker system of FIG. 1 showing a marking station, a curing station and a cool-down station.

FIG. 3 is a front view of the tester-marker system of FIG. 1 showing the marking station 32, the curing station 34 and the cool-down station 38 positioned over the bins.

Figure 4:
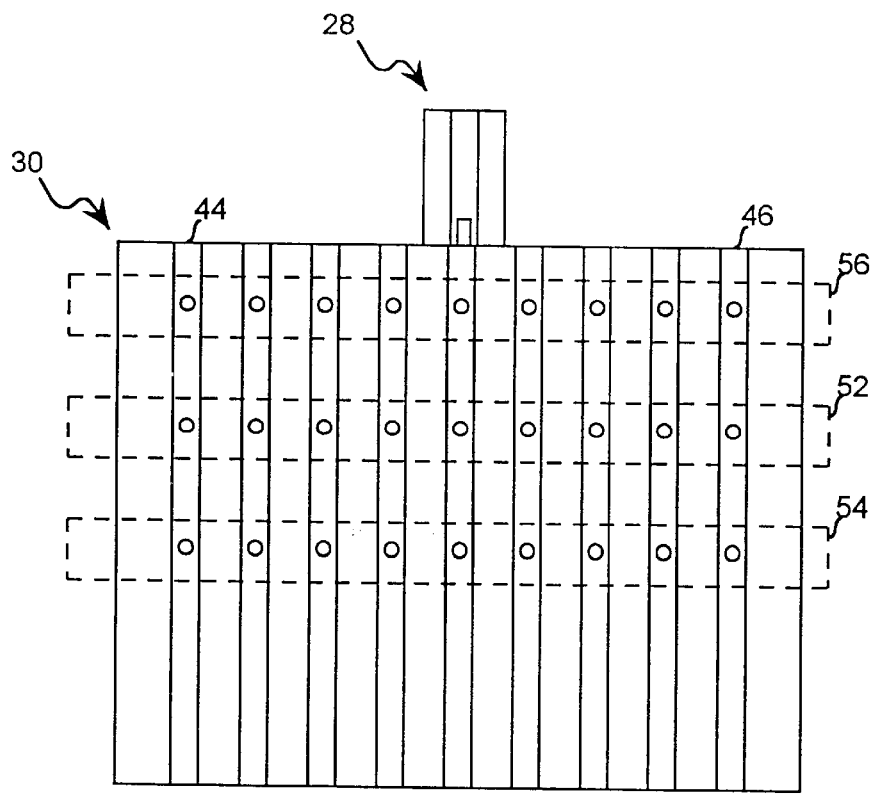
FIG. 4 is a front view of the bins of the tester-marker system of FIG. 1 showing the openings for a stop-pins.

FIG. 4 is a front view of the bins of the tester-marker system of FIG. 1 showing the openings for stop-pins. A set of stop pins 52 is for use by the marking station. Another set of stop pins 54 is for use with the curing station. Yet another set of stop pins 56 can be used by the cool-down station or for sequencing the release of integrated circuits into the marking station.

Figure 5:
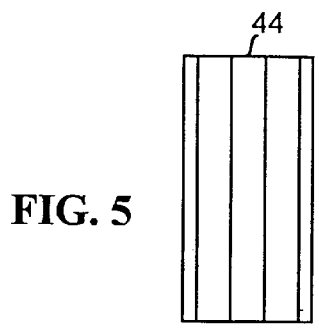
FIG. 5 is an expanded front view of the bins of FIG. 4.
Figure 6:
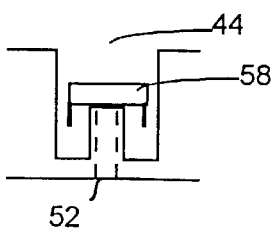
FIG. 6 is a side view of a bin of FIG. 5 showing an integrated circuit supported in the bin.

FIGS. 5 and 6 show the bins of FIG. 4 in more detail. FIG. 5 is an expanded front view of one of the bins 44.

FIG. 6 is a side view of the bin of FIG. 5 showing the integrated circuit 58 being supported in the bin 44.

Figure 7:
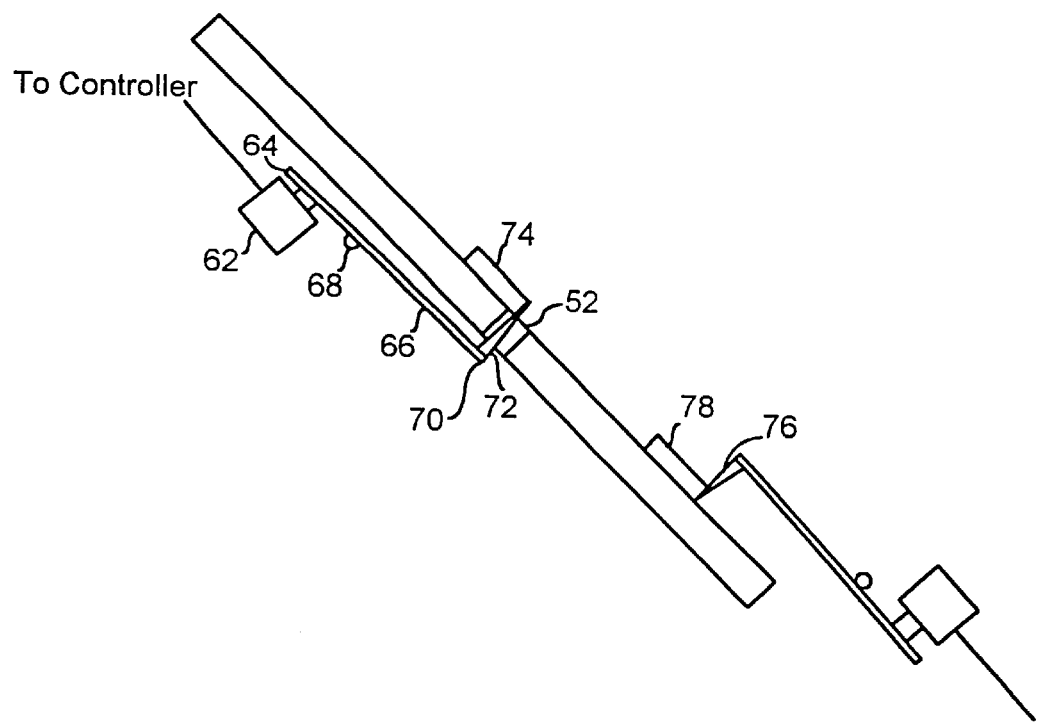
FIG. 7 is a side view of a solenoid and lever assembly attached to the stop-pin.

FIG. 7 is a side view of a solenoid and lever assembly attached to a stop-pin. A solenoid 62 is attached to one end 64 of a lever 66. The lever 66 pivots about pivot point 68. The other end 70 of the lever 66 is attached to a pin 72. The pin 72 is disposed in the opening 52 in the bin. A controller controls the solenoid 62 to raise and lower the pin 72 in the opening 52. As shown in FIG. 7, when the pin 72 is raised, the integrated circuit 74 is stopped in the bin. When the pin 72 is lowered, the integrated circuit 74 moves through the bin. In a preferred embodiment, each opening has a separate solenoid and lever assembly.

In an alternate embodiment, also shown in FIG. 7, no openings are used in the bins. The solenoid and lever assembly is positioned over the bin. When the pin 76 is lowered the integrated circuit 78 is stopped in the bin. When the pin 76 is raised, the integrated circuit 78 moves through the bin.

Figure 8:
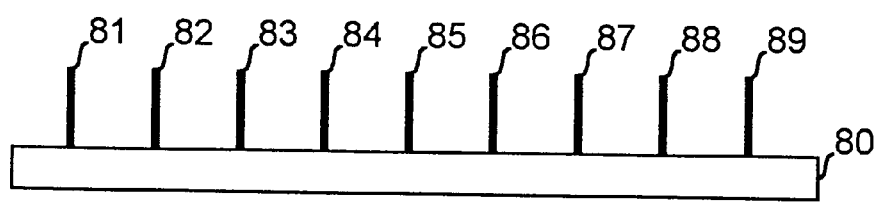
FIG. 8 is a front view of an assembly having multiple stop-pins.

FIG. 8 is a front view of an assembly having multiple stop-pins. The assembly has a support member 80 connected to pins 81–89. The support member 80 attaches to the lever of FIG. 7. The controller can raise and lower the support member 80 to simultaneously control the position of multiple integrated circuits in multiple bins.

Figure 9:
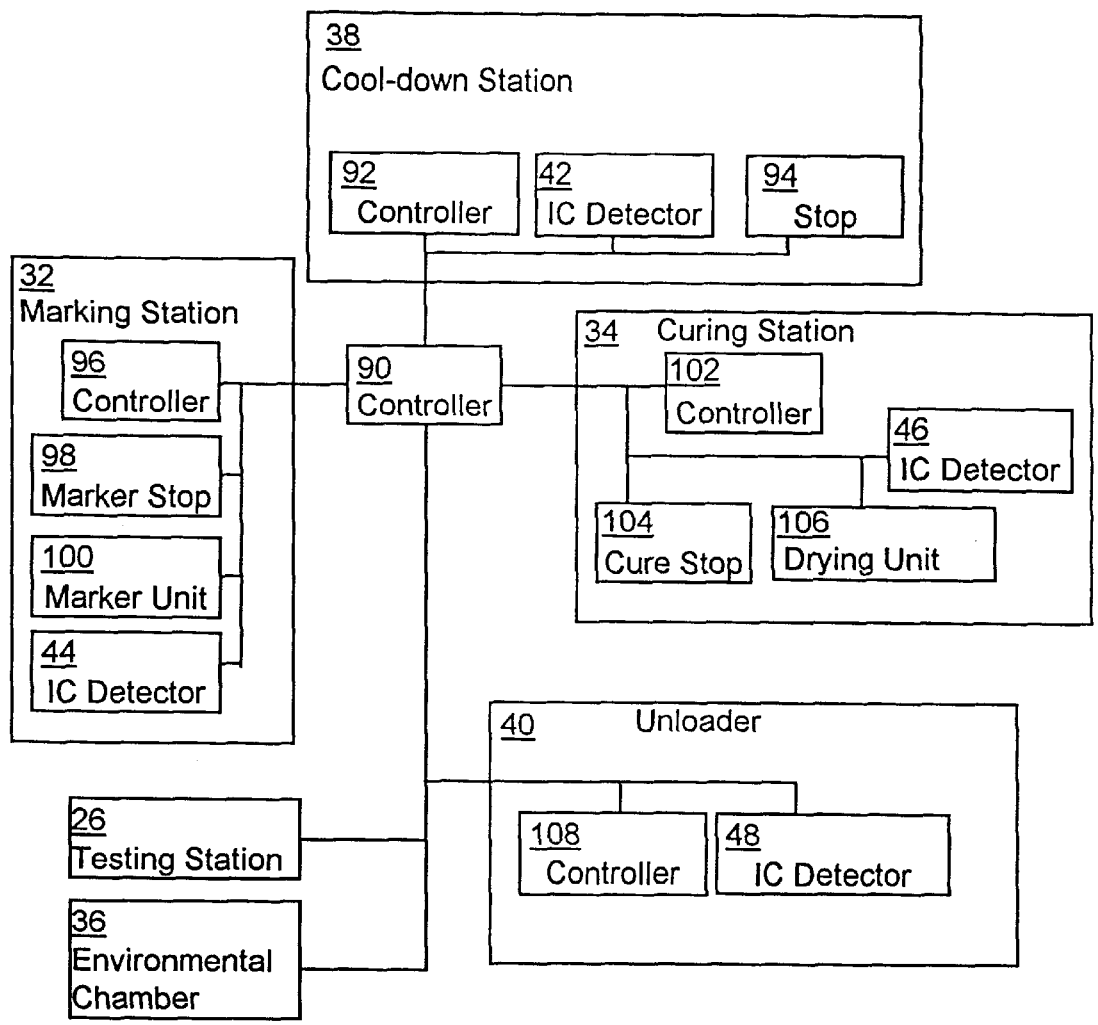
FIG. 9 is a block diagram of the tester-marker system of the present invention.

FIG. 9 is a block diagram of the marker system of the present invention. In one embodiment, a master controller 90 is connected to and interfaces with the marking station 32, curing station 34, testing station 26, environmental chamber 36, cool down station 38 and unloader 40.

Referring to FIGS. 1 and 9, the loader 22 receives the integrated circuits in the loader bins. The loader bins can be similar to the output bins of FIGS. 2 through 6. The loader 22 is positioned at an angle such that gravity causes the integrated circuits to move automatically through the bins. In one embodiment, the environmental chamber 36 heats the integrated circuits. A handler 24 moves the integrated circuits from the loader 22 to a testing station 26. After testing, the second handler 28 moves the integrated circuits to a desired bin: a pass bin if the integrated circuit passed the test, or a fail bin if the integrated circuit failed the test.

After an integrated circuit is tested, the handler places the integrated circuit (IC) in the appropriate bin as described above. The IC passes into the cool-down station 38. The cool-down station has a controller 92, IC detector 42 and a stop assembly 94. A suitable stop assembly is shown in FIG. 7. The IC detector 42 detects when an IC passes into the cool-down station and sends a signal to the controller 92. The controller 92 activates the stop assembly 94 to prevent the IC from moving for a predetermined amount of time sufficient to cool the IC. After the IC is sufficiently cool, the controller 92 releases the stop assembly 94 to allow the IC to flow to the marking station. In addition the controller 92 notifies the master controller 90 and the marking station controller 96 that an IC is being released from the bin in the cool-down station 38.

The marking station 32 has a detector 44 that detects that the IC is moving into the marking station and sends a signal to the marking station controller 96. The marking station controller 96 activates a marker stop assembly 98 (as shown in FIG. 7) to stop the IC. The controller 96 then causes the marker unit 100 to mark identification information on the IC such as the manufacturer, part number, lot number and date. As indicated above, in the preferred embodiment failed circuits are not marked. In an alternate embodiment, the marking station marks integrated circuits in the fail bin with indicia indicating that the integrated circuit failed the test. Although failed integrated circuits are typically sold for their salvage value, a marking that indicates that the integrated circuit failed the test is useful to discourage and prevent reselling of failed integrated circuits. After marking, the marking station controller 96 releases the marker stop assembly 98, and notifies the master controller 90 and curing station controller 102 that an IC is being released.

The curing station 34 has a detector 46 that detects that the IC is moving into the curing station and sends a signal to the curing station controller 102. The curing station controller 102 activates a cure stop assembly 104 (as shown in FIG. 7) to stop the IC and activates a drying unit 106 for a predetermined drying time. After curing, the curing station controller 102 releases the cure stop assembly 104, and notifies the master controller 90 and unloader controller 108 that an IC is being released.

The unloader 40 has a detector 48 that detects that the IC is moving into the unloader and sends a signal to the unloader controller 108. The detector 48 can also be used to indicate that the corresponding bin is full or jammed and the controller 108 can activate an alarm. The IC remains in the unloader until the IC is packaged in a rail or otherwise disposed of.

In this embodiment, multiple integrated circuits can be simultaneously cooled-down in the cool-down station 118, marked in the marking station 112 and cured in the curing station 114.

Although the marking station 32, curing station 34, cool-down station 38 and unloader 40 have been described with separate controllers, in an alternative embodiment, the stations do not have separate controllers and a single master controller controls the marking station 32, curing station 34, cool-down station 38 and unloader 40 in the marker-tester system.

ALTERNATE EMBODIMENTS

Figure 10:
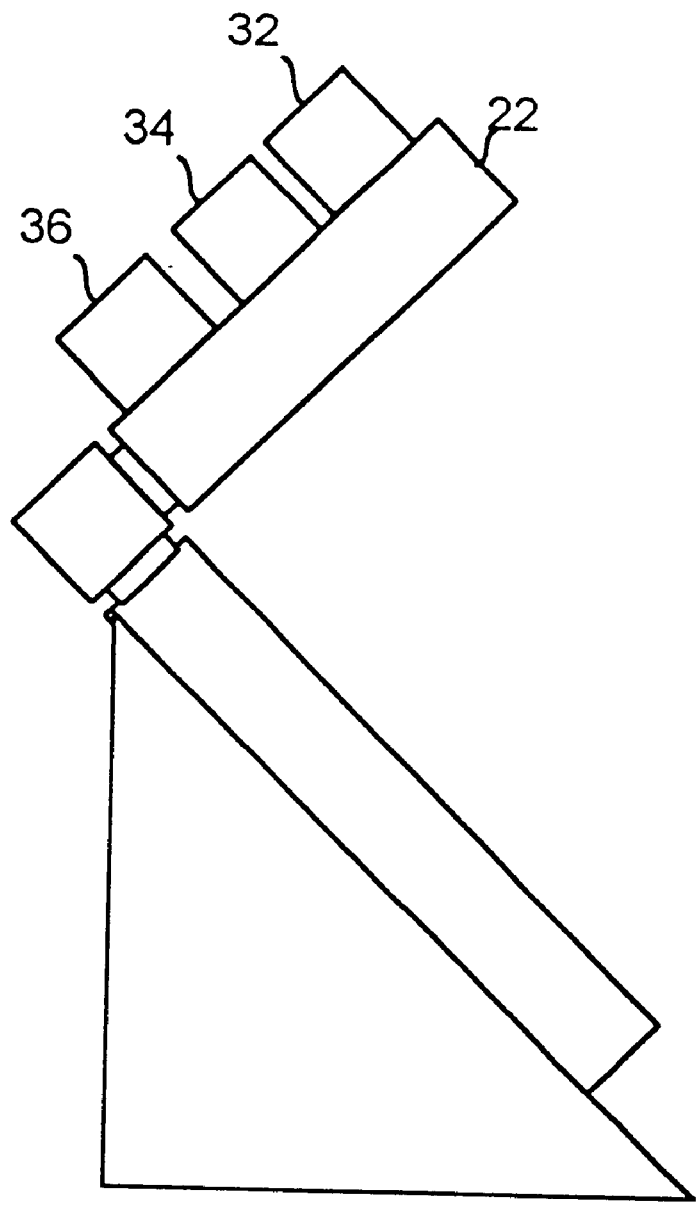
FIG. 10 is side view of a second embodiment of the tester-marker of the present invention.

FIG. 10 is side view of a second embodiment of the marker-tester of the present invention. This embodiment is similar to the embodiment of FIG. 1 therefore only the differences will be described. In this second embodiment, the marking station 32 and curing station 34 are on the loader 22; and, the integrated circuits are marked prior to testing.

Figure 11:
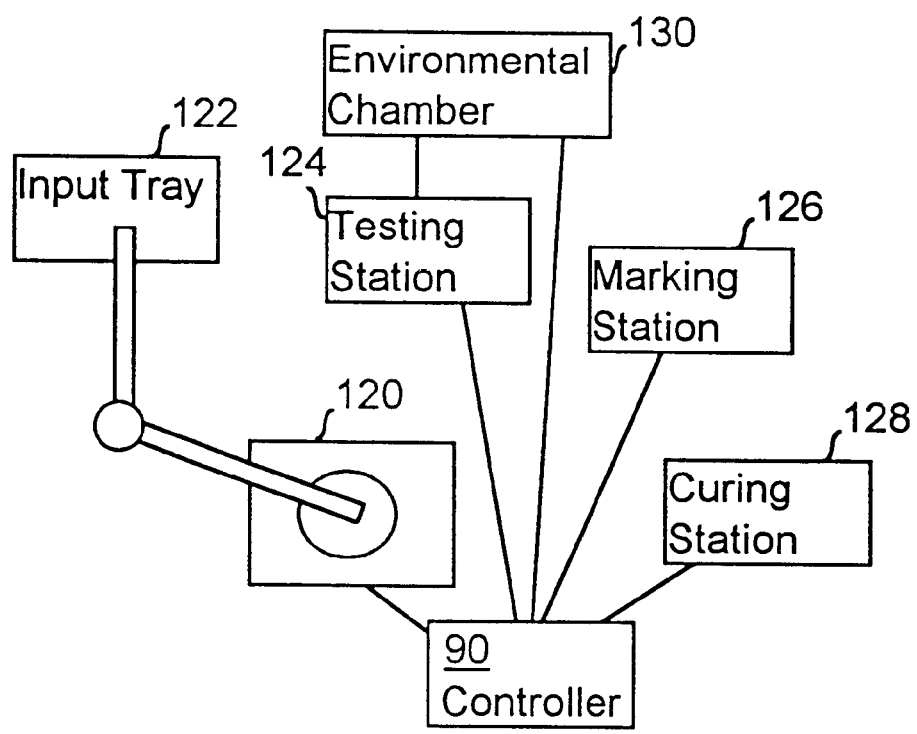
FIG. 11 is a diagram of a third embodiment of the tester-marker of the present invention that uses a robot arm.

FIG. 11 is a diagram of a third embodiment of the marker-tester of the present invention that uses a robot arm 120. This invention is similar to that of FIG. 1 except that the integrated circuits are in trays and the master controller 90 controls the robot arm 120 to move the integrated circuits between the input tray 122, testing station 124, marking station 126 and curing station 128. In an alternate embodiment, the robot arm 120, testing station 124, marking station 126 and curing station 128 each have a controller and communicate with the master controller 90 to control the flow of ICs between stations.

In another embodiment, the testing station 124 is placed inside an environmental chamber 130. The master controller synchronizes the operation of the robot arm, testing station and environmental chamber.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A system for testing and marking integrated circuits comprising:
   an environmental station to stress the integrated circuits before testing;
   a testing station for testing integrated circuits after being stressed in the environmental station, determining if the integrated circuits passed or failed, placing the integrated circuits in a pass bin if the integrated circuits passed, and placing the integrated circuits in a fail bin if the integrated circuits failed;
   a cool-down station to allow the integrated circuits to cool before marking the integrated circuits; and
   a marking station for marking identification information on the integrated circuits in the pass bin and for marking identification information on the integrated circuits in the fail bin that is different from the identification information marked on the integrated circuits in the pass bin.

2. A system for testing and marking integrated circuits comprising:
   a testing station for testing integrated circuits, determining if the integrated circuits passed or failed, and placing the integrated circuits in a pass bin if the integrated circuits passed; and
   a marking station for marking identification information on the integrated circuits in the pass bin;
   wherein the marking station further comprises:
      a detector to detect when an integrated circuit was received in the marking station,
      a marker-stop to position the integrated circuit for marking,
      a marker to mark the integrated circuit with the identification information, and
      a controller, responsive to the detector, for activating the marker-stop to position the received integrated circuit for marking, causing the marker to mark the integrated circuit, and after marking, releasing the marker-stop to allow the marked integrated circuit to exit the marking station.

3. The system of claim 2 further comprising:
   a sequencer-stop, wherein if the integrated circuits are in the marking station, the controller activates the sequencer-stop to prevent additional integrated circuits from entering the marking station.

4. The system of claim 2 further comprising:
   a curing stop, wherein the controller activates the curing stop before releasing the marker-stop to allow the marked integrated circuits to dry for a predetermined dry-time.

5. The system of claim 2, further comprising
   a cool-down station; and
   a conveyor to automatically move the integrated circuits from the cool-down station to the marking station.

6. The system of claim 5, wherein the conveyor comprises channels for supporting and automatically moving the integrated circuits, the pass bin and the fail bin, each having at least one channel,
   the channels causing the integrated circuits to automatically move from the cool-down station to the marking station,
   the cool-down station having a cool-down-stop to hold the integrated circuits within the channel for a predetermined cool-down time before allowing the integrated circuits to pass to the marking station.

7. The system of claim 2 wherein
   a robot arm moves the integrated circuits from the testing station to the marking station.

8. A marking station for use with a testing station having bins that supply tested integrated circuits, including at least one pass bin for holding integrated circuits that passed the tests, comprising:
   a detector to detect when an integrated circuit is received in the pass bin of the marking station;

a sequencer-stop to prevent integrated circuits from flowing into the marking station;

a marker to mark identification information on the integrated circuit in the pass bin;

a marker-stop to position the integrated circuit with respect to the marker for marking; and a controller that, in response to the detector, determines that the integrated circuit is in the marking station, then the controller activates the sequencer-stop to prevent additional integrated circuits from entering the marking station, activates the marker-stop to position the received integrated circuit for marking, causes the marker to mark the integrated circuit, and releases the marker-stop to allow the marked integrated circuit to exit the marking station after being marked.

9. A system for testing and marking integrated circuits comprising:

a testing station for testing integrated circuits, determining if the integrated circuits passed or failed, and placing the integrated circuits in a pass bin if the integrated circuits passed; and a marking station for marking identification information on the integrated circuits in the pass bin, including:
   a detector to detect when an integrated circuit is received in the marking station;
   a marker-stop to position the integrated circuit for marking; and
   a marker to mark the integrated circuit with the identification information; and a controller, responsive to the detector, for activating the marker-stop to position the received integrated circuit for marking, causing the marker to mark the integrated circuit, and after marking, releasing the marker-stop to allow the marked integrated circuit to exit the marking station, wherein the marker-stop includes
   a solenoid controlled by the controller;
   a lever coupled to the solenoid, and
   a pin attached to the lever, the pin being disposed with respect to the pass bin, such that the controller activates the solenoid to raise the pin so that the integrated circuit is stopped in the pass bin.

10. The system of claim 9, wherein the testing station is configured to place the integrated circuits in a fail bin if the integrated circuits failed;

further including a second marking station for marking identification information on the integrated circuits in the fail bin, including:
   a detector to detect when an integrated circuit is received in the marking station,
   a marker-stop to position the integrated circuit for marking;
   a marker to mark the integrated circuit with the identification information.

* * * * *